United States Patent
Chung

(10) Patent No.: US 8,313,877 B2
(45) Date of Patent: Nov. 20, 2012

(54) PHOTOLITHOGRAPHY MONITORING MARK, PHOTOLITHOGRAPHY MASK COMPRISING AN EXPOSURE MONITORING MARK, AND PHASE SHIFT MASK COMPRISING AN EXPOSURE MONITORING MARK

(75) Inventor: Woong Jae Chung, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 438 days.

(21) Appl. No.: 12/483,706

(22) Filed: Jun. 12, 2009

(65) Prior Publication Data

US 2010/0316939 A1    Dec. 16, 2010

(51) Int. Cl.
G03F 9/00     (2006.01)
G03F 1/00     (2012.01)
H01L 23/544   (2006.01)

(52) U.S. Cl. .............. 430/22; 430/5; 257/797
(58) Field of Classification Search ............ 430/5, 22; 257/797
See application file for complete search history.

(56) References Cited

U.S. PATENT DOCUMENTS

| | | | |
|---|---|---|---|
| 5,300,786 A | 4/1994 | Brunner et al. | |
| 6,004,706 A | 12/1999 | Ausschnitt et al. | |
| 6,440,616 B1 | 8/2002 | Izuha et al. | |
| 6,674,511 B2 | 1/2004 | Nomura et al. | |
| 6,710,853 B1 | 3/2004 | La Fontaine et al. | |
| 6,764,794 B2 | 7/2004 | Nakao et al. | |
| 6,777,145 B2 | 8/2004 | Zhou et al. | |
| 6,778,275 B2 * | 8/2004 | Bowes | 356/400 |
| 6,797,443 B2 | 9/2004 | Nakao et al. | |
| 6,811,939 B2 | 11/2004 | Nakao et al. | |
| 6,866,976 B2 * | 3/2005 | Asano et al. | 430/30 |
| 7,352,451 B2 | 4/2008 | Levinski et al. | |
| 7,352,453 B2 | 4/2008 | Mieher et al. | |
| 7,368,206 B2 | 5/2008 | Fay et al. | |
| 7,382,447 B2 | 6/2008 | Mieher et al. | |
| 7,439,531 B2 | 10/2008 | Van Bilsen et al. | |
| 2006/0024850 A1 | 2/2006 | Monahan et al. | |
| 2007/0114678 A1 * | 5/2007 | Van Haren et al. | 257/797 |
| 2007/0259280 A1 | 11/2007 | Fujisawa et al. | |
| 2008/0225254 A1 * | 9/2008 | Komine et al. | 355/53 |
| 2009/0015813 A1 | 1/2009 | Maeda | |

OTHER PUBLICATIONS

D. Wheeler, E. Solecky, T. Dinh, R. Mih, "Phase Shift Focus Monitor Applications to Lithography Tool Control", Mar. 12, 1997, Proc. SPIE 3051, pp. 225-233.*

Apelgren et al., "Litho Cell Control using MPX", Proc. of SPIE vol. 6518, 2007, pp. 1-10.

Choi et al., "Influence of material on process focus budget and process window of 80 nm DRAM devices", Proc. of SPIE, vol. 5752, 2005, pp. 570-577.

Garza et al., "Degradation Mechanism and Materials for 157 nm Pellicles", Proceedings of SPIE, vol. 5377, 2004, pp. 527-536.

(Continued)

Primary Examiner — Mark F Huff
Assistant Examiner — Jonathan Jelsma
(74) Attorney, Agent, or Firm — Wells St. John, P.S.

(57) ABSTRACT

A photolithography monitoring mark on a substrate includes a plurality of sets of lines. Individual of the sets include a plurality of substantially parallel lines comprising different widths arrayed laterally outward in opposing lateral directions from an axial center of the set. The different widths decrease in each of the opposing lateral directions laterally outward from the axial center of the set. Other implementations are disclosed.

27 Claims, 6 Drawing Sheets

OTHER PUBLICATIONS

La Fontaine et al., "Study of the Influence of Substrate Topography on the Focusing Performance of Advanced Lithography Scanners", Proceedings of SPIE, vol. 5040 (2003) pp. 570-581.

McQuillan et al., "Phase Shift Focus Monitoring Techniuqes", Proc. of SPIE, vol. 6154, 2006, pp. 1-9.

Shiode et al., "A Novel Focus Monitoring Method Using Double Side Chrome Mask", Proc. of SPIE, vol. 5754, 2005, pp. 303-314.

Yabe et al., "Monitoring system of effective exposure dose and focus", Proc. of SPIE, vol. 5752, 2005, pp. 864-873.

Zhang et al., "Across Wafer Focus Mapping and Its Applications in Advanced Technology Nodes", Proc. of SPIE vol. 6154, pp. 1-10.

* cited by examiner

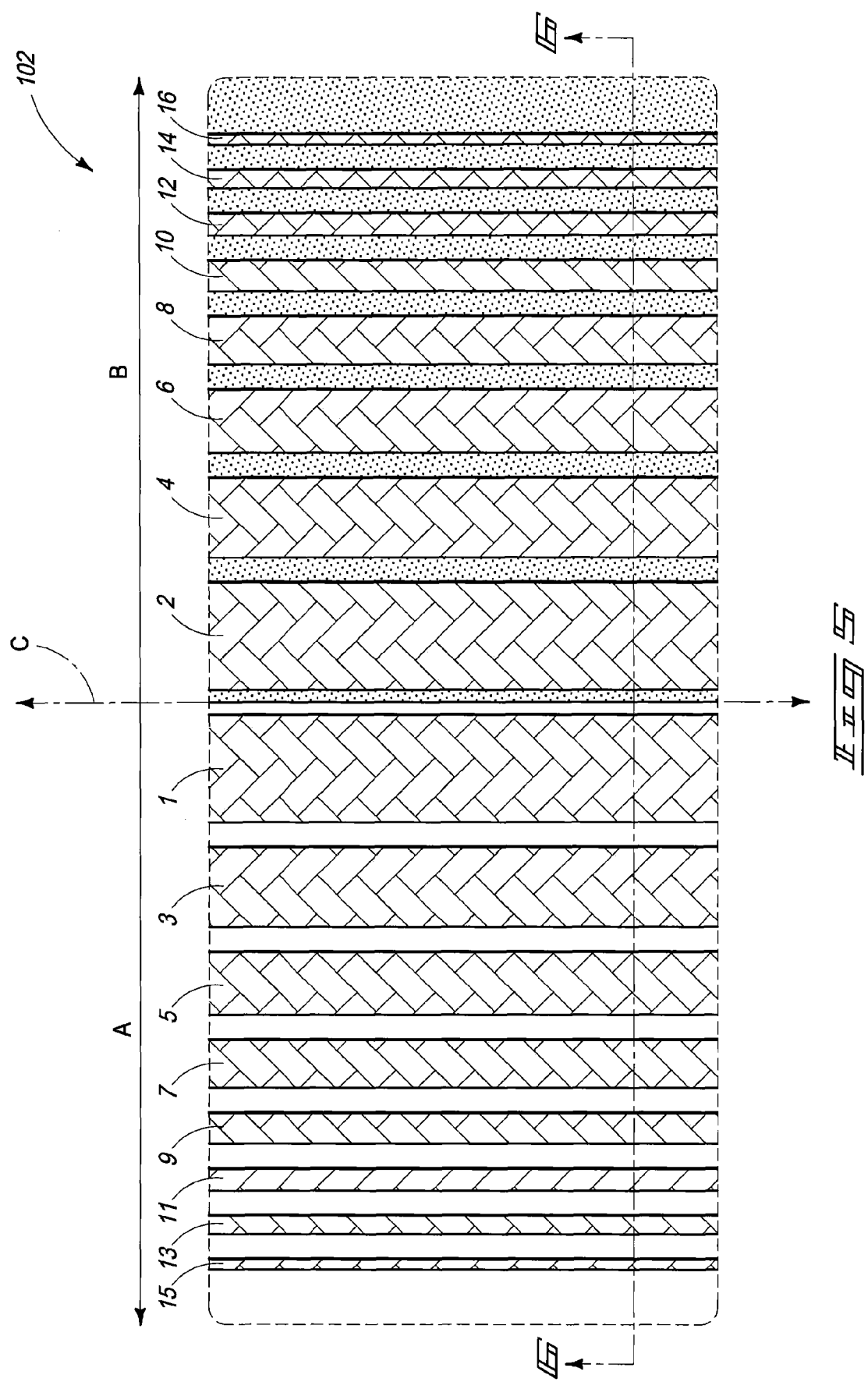

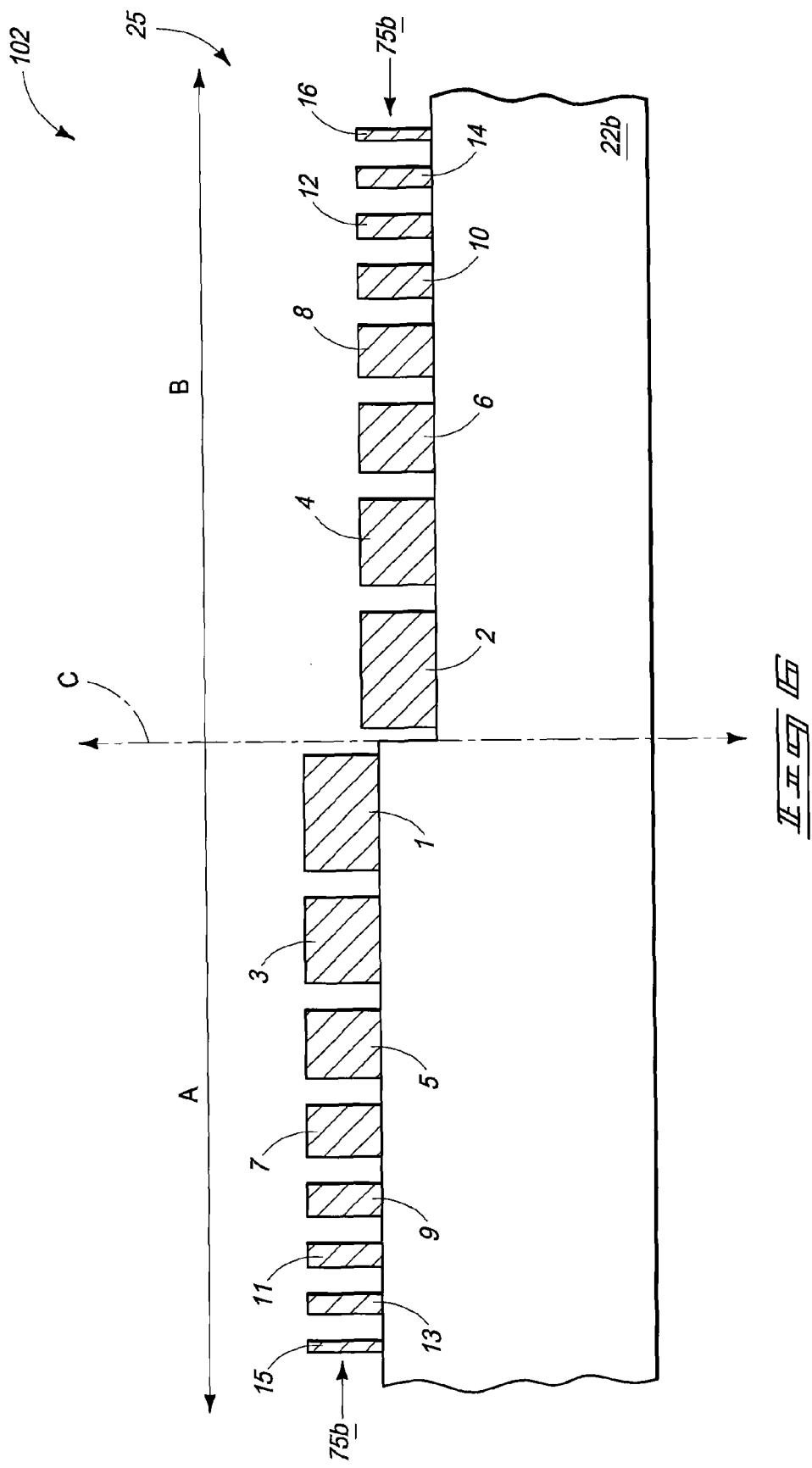

PHOTOLITHOGRAPHY MONITORING MARK, PHOTOLITHOGRAPHY MASK COMPRISING AN EXPOSURE MONITORING MARK, AND PHASE SHIFT MASK COMPRISING AN EXPOSURE MONITORING MARK

TECHNICAL FIELD

Embodiments disclosed herein pertain to photolithography monitoring marks, to photolithography masks comprising an exposure monitoring mark, and to phase shift masks comprising an exposure monitoring mark.

BACKGROUND

Integrated circuitry fabrication typically involves lithographic processing to transfer patterns from an imaging layer to an underlying substrate material which will form part of the finished circuitry. One example process is photolithography, for example wherein the imaging layer comprises photoresist. A form of radiant energy is passed through a radiation-patterning tool and onto the photoresist. The radiation-patterning tool is commonly referred to as a mask, photomask, or reticle. The term "photomask" has traditionally been used to refer to masks which define a pattern for an entire side of a substrate, while the term "reticle" traditionally refers to a masking tool which defines a pattern for only a portion of a side of a substrate. A reticle typically encompasses multiple die/chip areas of the substrate being patterned. The reticle and substrate bearing the photoresist are moved relative to one another such that multiple discrete exposures of the substrate through the reticle completely pattern the entire side of the substrate. The term "mask" as used herein, is generic to any radiation-patterning tool, whether existing or yet-to-be developed, and whether defining a pattern on a portion of or on an entire side of a substrate.

It is desirable that the pattern in the mask be replicated onto the substrate being patterned as closely as possible and in the desired location. Three variables or parameters which impact the pattern which is formed on the substrate are dose, focus, and overlay/x-y alignment. Dose may be considered as the quanta of energy passed through the mask onto the substrate being patterned, and is largely determinative of feature dimensions in the lateral or horizontal direction. Focus is the measure of the distance of the substrate being exposed relative to the lens through which the radiation is passed, and is largely determinative of feature aspects in profile or vertical direction. Overlay is a measure of accuracy of alignment of the substrate and mask relative to x and y axes.

Photolithography equipment in production is periodically calibrated to achieve acceptable dose, focus, and overlay to replicate the mask patterns onto production substrates. Registration and other monitoring marks are typically provided within the mask outside of the areas where circuitry is being fabricated. These monitoring marks may be used in calibration of the production photolithography equipment and to determine accepted or rejected patterning with respect to the production substrates being processed.

BRIEF DESCRIPTION OF THE DRAWINGS

FIG. 5 is an enlarged portion of FIG. 4.

FIG. 6 is a sectional view taken through line 6-6 in FIG. 5.

DETAILED DESCRIPTION OF EXAMPLE EMBODIMENTS

Figure 1:
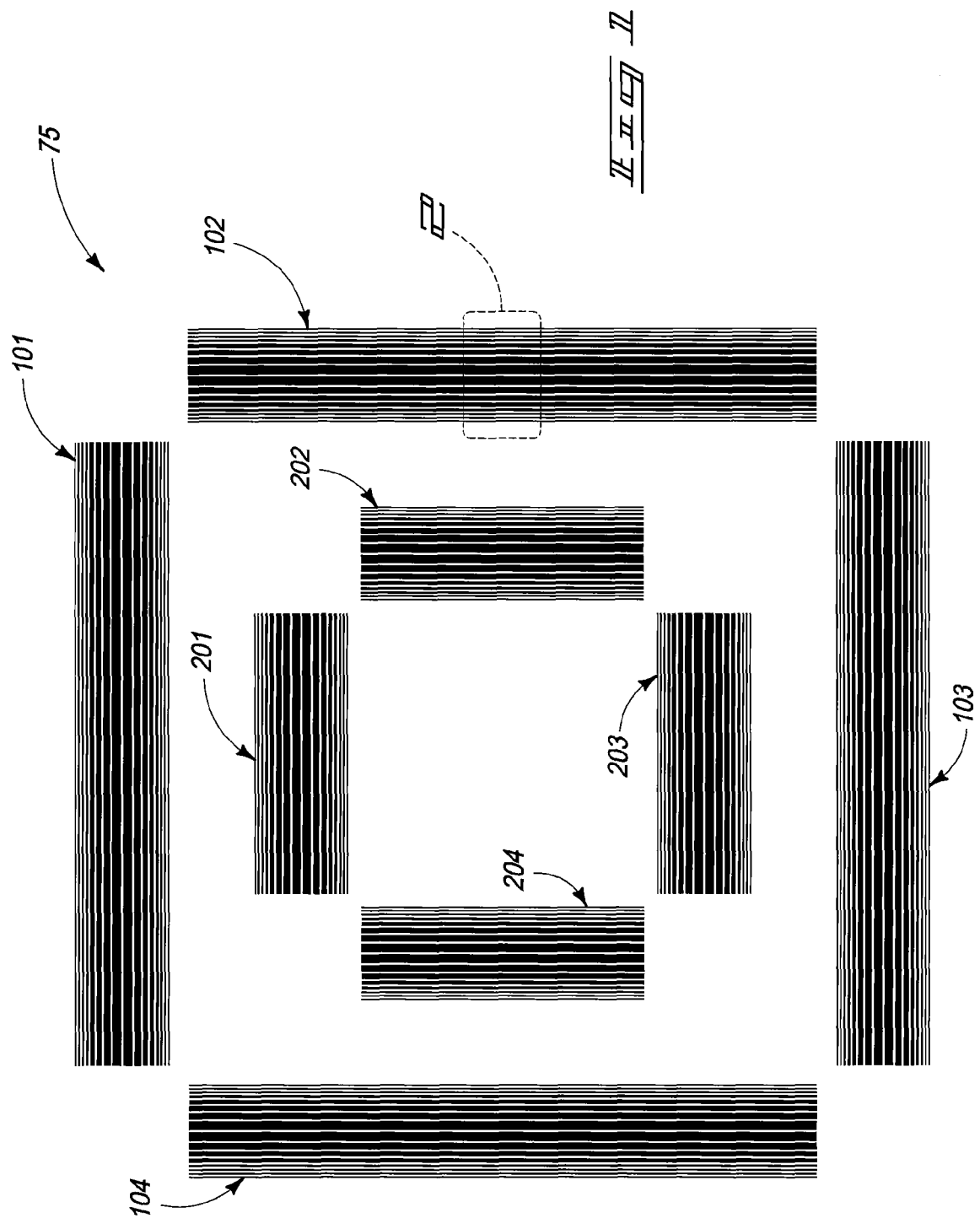
FIG. 1 is a diagrammatic top plan view of a photolithography monitoring mark usable on a substrate in accordance with an embodiment of the invention.
Figure 2:
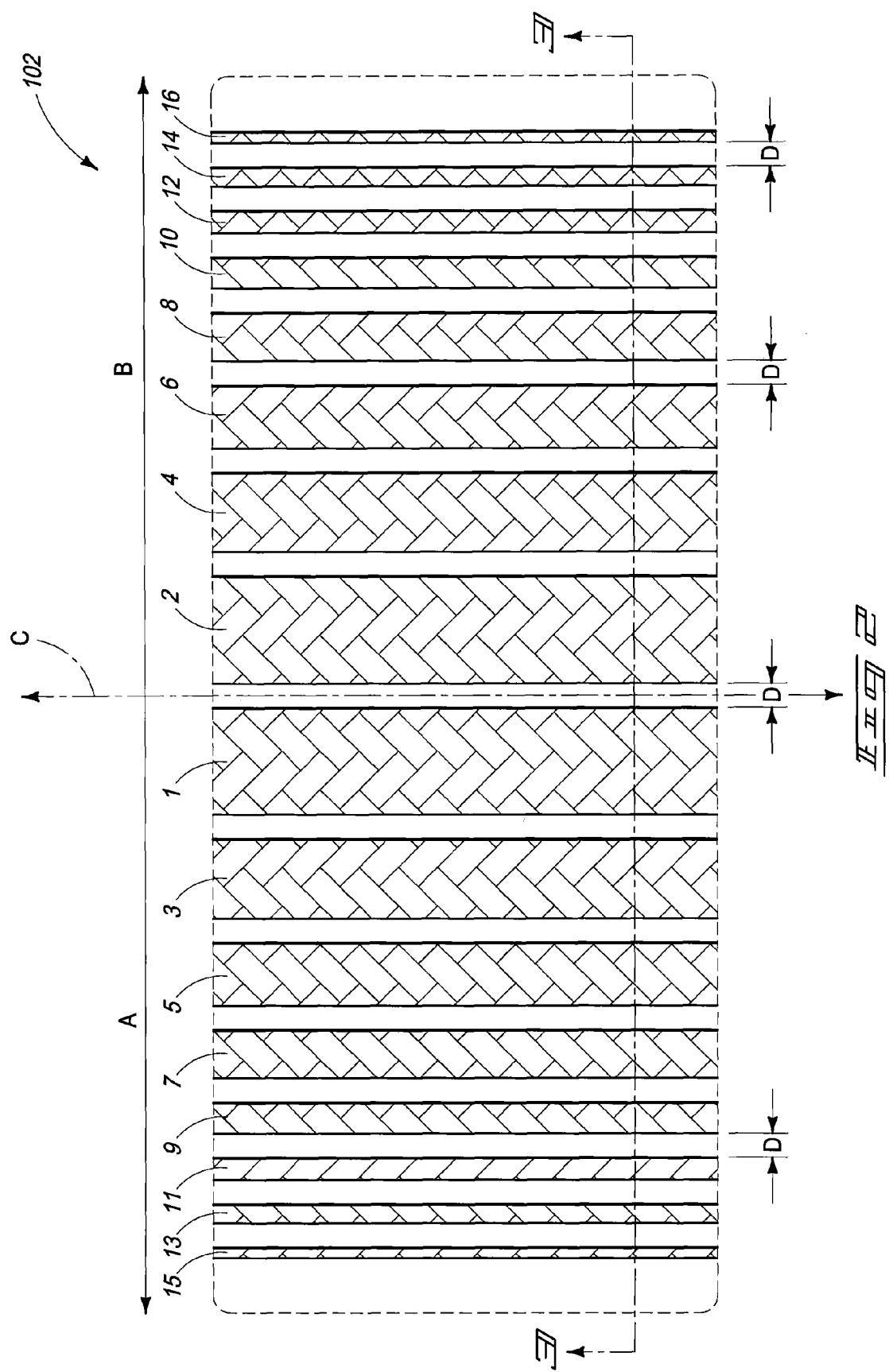
FIG. 2 is an enlarged portion of FIG. 1.

An example embodiment photolithography monitoring mark is initially described with reference to FIGS. 1 and 2. FIG. 1 depicts a photolithography monitoring mark 75, while FIG. 2 shows an enlarged view of a portion thereof. Monitoring mark 75 comprises a plurality of sets of lines. For example, sets 101, 102, 103, 104, 201, 202, 203 and 204 are shown, and which are individually longitudinally elongated along a respective longitudinal direction. Fewer or more sets might be used and provided in any orientation relative to one another, with FIG. 1 depicting but one example arrangement.

Referring to FIGS. 1 and 2, individual of the sets comprise a plurality of substantially parallel lines 1, 2, 3, 4, 5, 6, 7, 8, 9, 10, 11, 12, 13, 14, 15, and 16 comprising a number of different widths and which are arrayed laterally outward in opposing lateral directions from an axial center of the set. For example, FIG. 2 shows individual set 102 having an axial center C, with lines 1, 3, 5, 7, 9, 11, 13 and 15 being positioned laterally outward in lateral direction A from axial center C, while lines 2, 4, 6, 8, 10, 12, 14 and 16 are positioned laterally outward in an opposing lateral direction B from axial center C. The different widths decrease in each of the opposing lateral directions laterally outward from the axial center of the set. In one embodiment, some, and only some, of the lines have the same width in individual of the sets. For example, respective line pairs 1/2, 3/4, 5/6, 7/8, 9/10, 11/12, 13/14 and 15/16 have the same width in each pair. Further, FIG. 2 depicts an example embodiment wherein those lines having the same width are on opposing lateral sides A and B of axial center C of the set. FIG. 2 also depicts an embodiment wherein width in each succeeding line in even subset 2-16 and in odd subset 1-15 decreases in each line in the subset sequence. However, adjacent subgroups of two or more lines in lateral directions A and B may be of common width (not shown) as long as line width decreases from one subgroup to another in each of the opposing lateral directions laterally outward from the axial center of the set. For example, and not shown, lines 2/4 could each be of the same width, lines 6/8 could each be of the same width if less than that of the width of each of lines 2/4, and lines 10/12/14/16 could each be of the same width as long as such is less than that of the width of each of lines 6/8. Alternate configurations could be used.

Regardless, in one embodiment, the number of different lines and widths in individual of the sets is at least three, and in one embodiment is at least eight. FIG. 2 depicts an example wherein the number of different lines is sixteen, and the number of different widths is eight. Regardless, in one embodiment, number of different widths may be equal to one half of the number of lines in individual of the sets. Again, set 102 in FIG. 2 depicts such an example. In one embodiment, and also as is shown by way of example with respect to set 102 in FIG. 2, the lines on opposing lateral sides of the axial center of individual of the sets are in mirror-image relationship relative one another from the axial center. Regardless, in one embodiment, and as shown with set 102 in FIG. 2, the lines in a set may be equally spaced from each immediately adjacent line. For example, set 102 in monitoring mark 75 in FIGS. 1 and 2 has each immediately adjacent two lines separated by a constant distance D. Regardless, in one embodiment, the lines in individual of the sets are straight, for example as shown. Alternately, the lines in individual of the sets may be curved, include a combination of straight and curved segments, and/or include a combination of straight and/or curved segments which are angled relative immediately adjacent segments. Further and regardless, the lines may or may not individually be of constant width. If not of constant width, "width" as referred to herein would be the average width of the individual line.

In one embodiment, the lines in individual of the sets are everywhere spaced from one another. For example, in the depicted embodiment, no two of lines 1-16 touch one another. Regardless, in one embodiment, the sets are everywhere spaced from one another. For example, FIG. 1 shows an embodiment wherein no two of sets 101, 102, 103, 104, 201, 202, 203, 204 touch one another. Alternate embodiments are of course contemplated wherein some lines within individual of the sets may contact one another, and/or wherein one or more of the sets may contact one or more others of the sets.

Regardless, individual of the sets may be the same or different from any other of the sets. FIGS. 1 and 2 depict an embodiment wherein sets 101, 102, 103 and 104 are the same relative each other, and wherein sets 201, 202, 203 and 204 are the same relative one another. However, none of the sets need be the same as any other set and not all of the individual sets need comprise a plurality of substantially parallel lines as long as some plurality (at least two) of sets of lines comprise a plurality of substantially parallel lines comprising different widths arrayed laterally outward in opposing lateral directions from an axial center of the set where the different widths decrease in each of the opposing directions laterally outward from the axial center of the set.

In one embodiment, the plurality of sets comprises a first set collection and a second set collection forming respective first and second outlines which are concentric relative one another. For example, sets 101/102/103/104 may be considered as a first set collection forming a first outline in the shape of a square. Sets 201/202/203/204 may be considered as a second set collection forming a second outline in the shape of a square which is concentric relative to the square first outline. FIG. 1 also depicts an example embodiment wherein first outline 101/102/103/104 comprises separate spaced segments 101, 102, 103 and 104. Analogously, second outline 201/202/203/204 comprises separate spaced segments 201, 202, 203 and 204. Alternate outlines may of course be fabricated, and whether any of such comprise separate spaced segments or wholly interconnected segments, for example circles, elipses, triangles, quadrilaterals, rectangles, pentagons, hexagons, etc. Alternately, no polygonal or other outline might be formed by the plurality of sets of lines.

Photolithography monitoring marks may be formed on any substrate, whether such substrate is existing or yet-to-be developed. As an example, the substrate on which the monitoring mark is received may comprise at least part of a photolithography mask. A reticle is but one example photolithography mask. Regardless, in one example, the substrate on which the monitoring mark is received may comprise photoresist in which the monitoring mark is formed. In one embodiment, the substrate on which the monitoring mark is received comprises a semiconductor substrate.

Figure 3:
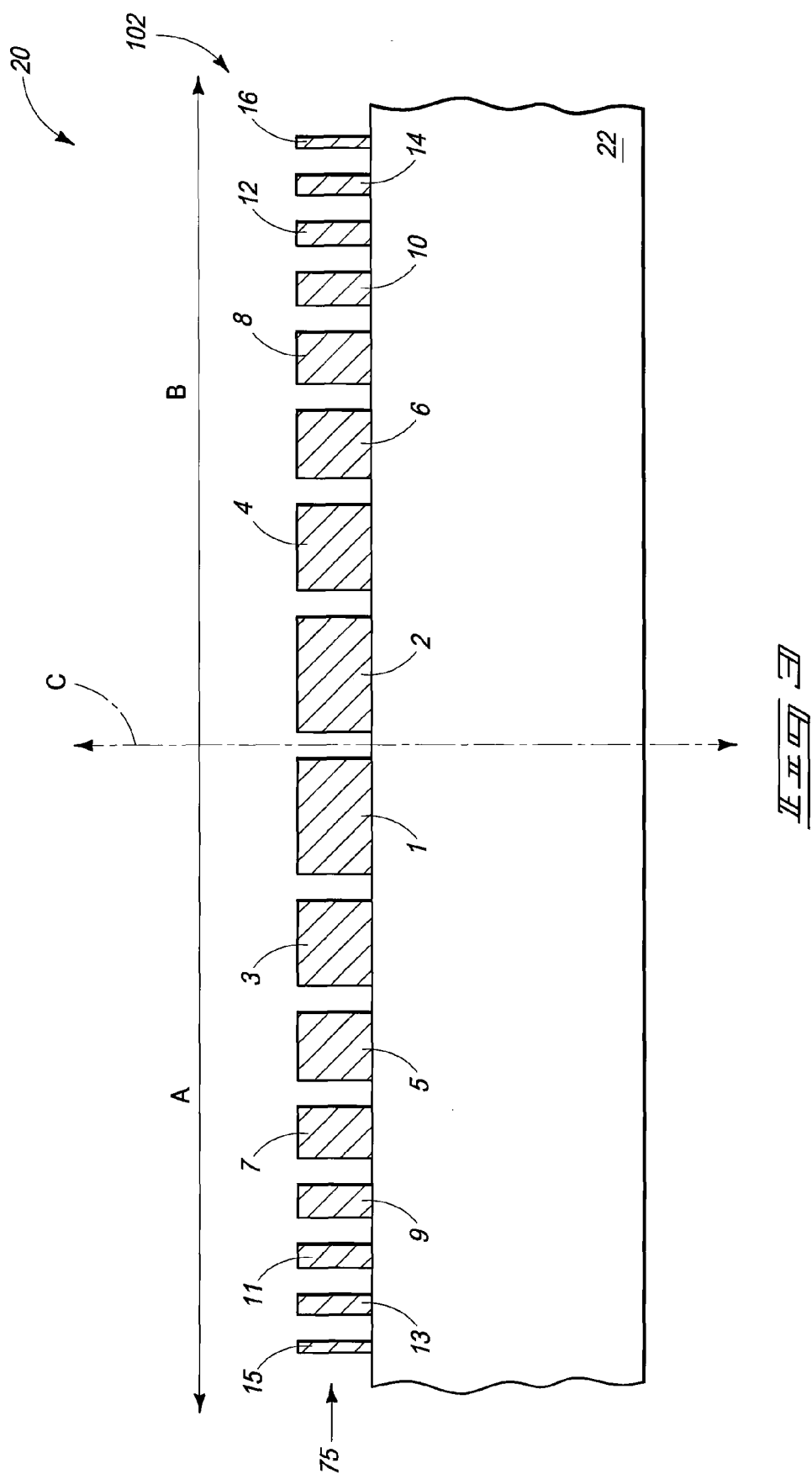
FIG. 3 is a diagrammatic sectional view of a substrate comprising an exposure monitoring mark in accordance with an embodiment of the invention as would be taken through line 3-3 in FIG. 2.

Consider for example FIG. 3 which comprises a substrate 20 which may be a semiconductor substrate or other substrate. In FIG. 3, like numerals from the first-described embodiment have been used where appropriate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described immediately above as well as to photomasks and other radiation patterning tools, including a reticle. Substrate 20 comprises a substrate 22 upon which set 102 of monitoring mark 75 has been formed. For example and by way of example only, substrate 20 may comprise a photolithography mask with exposure monitoring mark 75 comprising a portion thereof. Substrate 22 may comprise a transparent substrate which allows radiation of a selected wavelength to pass therethrough, and lines 1-16 may be opaque to the radiation of selected wavelength. For example, substrate 22 may comprise quartz and lines 1-16 may comprise chrome. In one embodiment, photolithography mask 20 may comprise a reticle.

As another example, the depicted material in which monitoring mark 75 is formed may comprise photoresist. For example, the monitoring mark may result from photolithographic processing of photoresist on a substrate 20 using a photolithography mask followed by develop of the photoresist. In other words, the material from which lines 1-16 are formed could be patterned photoresist. Regardless, any one or combination of the attributes as described above may be used in forming exposure monitoring mark 75 on substrate 22.

Further and regardless, some attribute(s) of the photolithographic processing could be measured or otherwise analyzed by examination of monitoring mark 75 formed as part of substrate 20. In such or another embodiment, substrate 20 may comprise a semiconductor substrate where some of substrate 22 comprises semiconductive material. Alternately or additionally, some material of which monitoring mark 75 is composed may comprise semiconductor material. As an example, substrate 20 might not comprise photoresist, with monitoring mark 75 resulting from etching action relative to substrate 20 using photoresist and/or another masking material as an etch mask, followed by removal of such mask. Additional or alternate substrates are of course contemplated.

Figure 4:
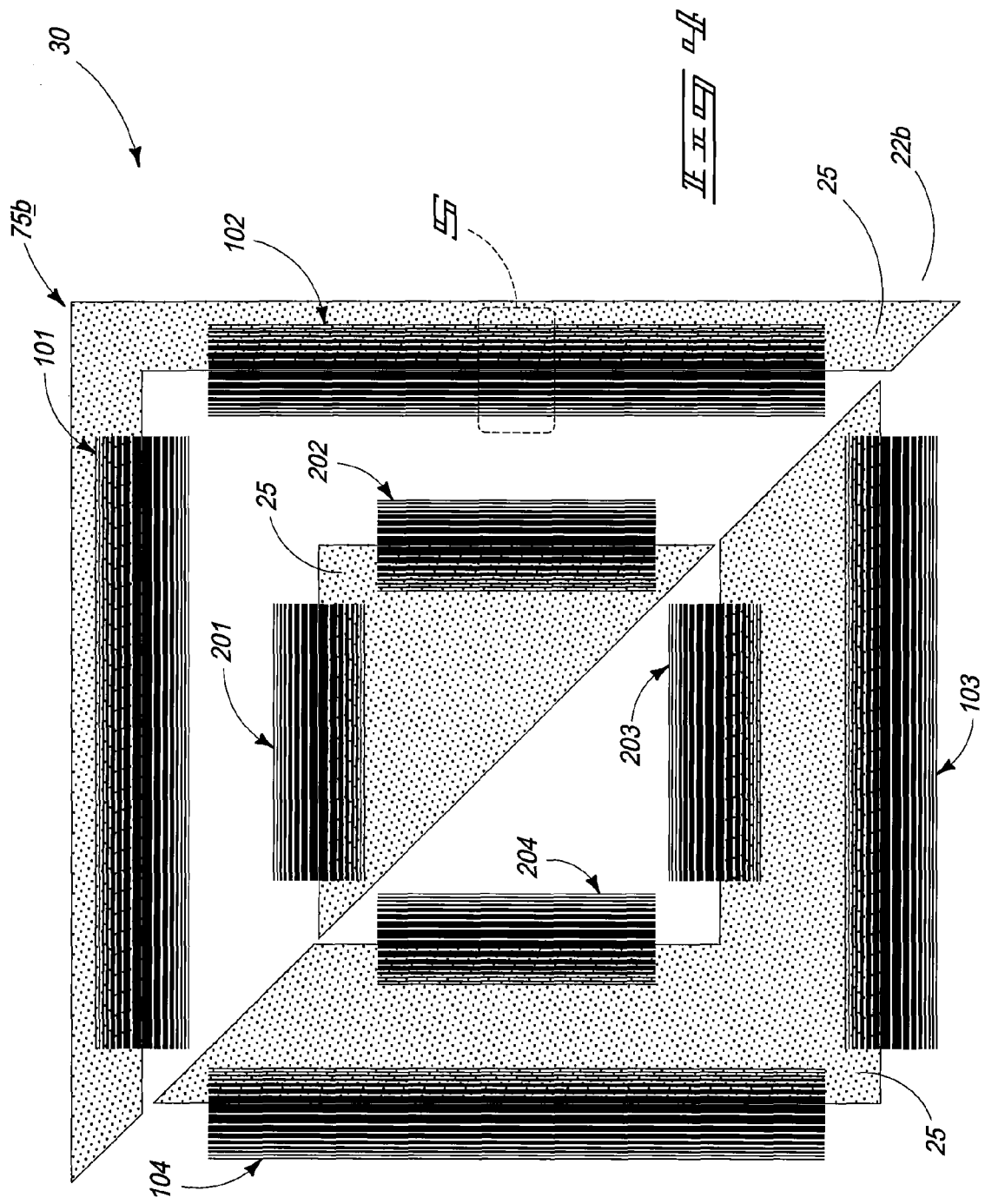
FIG. 4 is a diagrammatic top plan view of a photolithography mask comprising an exposure monitoring mark in accordance with an embodiment of the invention.

One embodiment encompasses a phase shift mask comprising an exposure monitoring mark. One such example embodiment is shown and described with respect to FIGS. 4-6 depicting a portion of an example phase shift mask 30. Like numerals from the first-described embodiments have been used where appropriate, with some construction differences being indicated with the suffix "b" or with different numerals. Phase shift mask 30 comprises a transparent substrate 22b which allows radiation of a selected wavelength to pass there-through, with quartz being an example material. A plurality of sets of lines is received over transparent substrate 22b, with such lines being opaque to the radiation of selected wavelength and forming an exposure monitoring mark 75b. Individual of the sets comprise a plurality of substantially parallel spaced opaque lines comprising different widths arrayed laterally outward in opposing lateral directions from an axial center of the set.

The different widths decrease in at least one of the opposing lateral directions laterally outward from the axial center of the set. In the depicted FIGS. 4-6 embodiment, the different widths in individual of the sets decrease in both of the opposing lateral directions A and B, as in the above first-described embodiment exposure monitoring mark 75. Alternately, the different widths in individual of the sets may decrease in only one of the opposing lateral directions. Exposure monitoring mark 75b in top plan view is of the same horizontal layout as monitoring mark 75.

Transparent substrate 22b comprises phase shift regions 25 received within only about one axial half from axial center C of individual of the depicted sets of lines. In the context of this document, "within only about one axial half" means fifty plus or minus ten percent of average axial width of the individual set of lines under analysis. Accordingly, the phase shift regions might be received within anywhere from forty percent to sixty percent of average axial width of the individual set of lines under analysis. In the example FIGS. 4-6 embodiment, phase shift regions 25 are shown as being etched or recessed portions of transparent substrate 22b over which the individual lines are formed. Alternately by way of example, transparent material could be added over substrate 22b. Regardless, any one or more of the attributes described above with respect to exposure monitoring mark 75 may be used with respect to exposure monitoring mark 75b.

Photolithography monitoring marks in embodiments of the invention may be used in any existing or yet-to-be-developed manner. For example, one or more such monitoring marks may be formed on a production substrate to determine variation from desired x-y alignment.

Monitoring marks in accordance with the invention may also be used for calibrating production equipment and/or for determining deviation from set parameters in a production wafer with respect to one or both of dose and focus. For example, dose and focus are significant parameters of photolithography scanner or stepper performance in the making of an integrated circuit. Photolithography process equipment is incredibly expensive, and the vendors of such equipment provide techniques for calibrating their respective systems with respect to various parameters including dose, focus and x-y overlay alignment. Calibration of such equipment takes significant time to conduct which correspondingly results in down-time of the equipment which cannot be used in actual production during such calibration.

Accordingly, it would be desirable to determine calibrations for such equipment using non-production or off-line photolithography processing equipment to enable better maximizing of the very expensive production equipment. It would also be desirable to determine calibration settings for production photolithography equipment of different manufacturers which minimizes equipment downtime for calibration. Additionally, it would be desirable to determine equipment calibration settings such as dose, focus, x-y registration and others without separate tests or analysis being required for each. Use of photolithography marks in accordance with embodiments of the invention may enable one or more of the above objectives to be obtained. For example, photolithography monitoring marks in accordance with embodiments of the invention might be used to monitor dose and focus together, and using any different incident radiation wavelength.

As an example, a calibration wafer could be produced using a reticle or other mask bearing one or more photolithography monitoring marks in accordance with embodiments of the invention. A series of the same monitoring marks could be projected along one of the x or y axes over a wafer surface at different focus settings and constant dose using the actual production photolithography/metrology equipment. The different focus settings may result in relative movement in the projected image of projected lines across such axis as known by people of skill in the art, and for example as described in U.S. Pat. No. 6,710,853. Such substrate may also be projected with the same reticle along the other of the x and y axes, wherein focus is held constant and dose is varied. Such a substrate may then be examined by off-line overlay metrology equipment, with data extracted from such analysis which can then be used to calibrate the more costly production equipment which produced the calibration wafer. Accordingly, most if not all of the calibration time used in production equipment is eliminated, with such determination being conducted using less expensive off-line overlay or other metrology equipment.

For example, the above-described calibration wafer might be analyzed by off-line equipment to produce a graph wherein the x axis measures focus above (positive) and below (negative) some baseline setting. The y axis could be provided as average values of x-y displacement for the different focus settings. A series of line approximations can be made for the different doses. Polynomial equations can be derived for the respective lines, with slope determinations from the graph for individual lines indicating dose condition that may be used to calibrate the expensive on-line production equipment. Accordingly as an example, both dose and focus calibrating parameters may be determined for production equipment without using such production equipment for the actual calibration analysis, thereby increasing up-time for the production equipment.

In another example, monitoring marks in accordance with the invention may also be examined on actual production wafers for determining deviation from desired values for one or any combination of focus, dose, x-y alignment and other metrics.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A photolithography monitoring mark on a substrate, the monitoring mark comprising:
    a plurality of sets of lines, individual of the sets comprising:
        a plurality of substantially parallel lines comprising different widths arrayed laterally outward in opposing lateral directions from an axial center of the set to respective opposing laterally outermost edges of the set; and
        the different width of each succeeding line decreasing in each of the opposing lateral directions laterally outward from the axial center of the set to its opposing laterally outermost edge of the set, the lines in individual of the sets being equally spaced from each immediately adjacent line.

2. The monitoring mark of claim 1 wherein the lines on opposing lateral sides of the axial center of individual of the sets are in mirror-image relationship relative one another from the axial center.

3. The monitoring mark of claim 1 wherein the lines in individual of the sets are straight.

4. The monitoring mark of claim 1 wherein the lines in individual of the sets are everywhere spaced from one another, and wherein the sets are everywhere spaced from one another.

5. The monitoring mark of claim 1 wherein the substrate on which the monitoring mark is received comprises at least part of a photolithography mask.

6. The monitoring mark of claim 1 wherein the substrate on which the monitoring mark is received comprises photoresist in which the monitoring mark is formed.

7. The monitoring mark of claim 1 wherein the substrate on which the monitoring mark is received comprises a semiconductor substrate.

8. The monitoring mark of claim 1 wherein individual of the sets are longitudinally elongated along a longitudinal direction and the axial center is parallel the longitudinal direction.

9. A photolithography monitoring mark on a substrate, the monitoring mark comprising:
a plurality of sets of lines, individual of the sets comprising:
a plurality of substantially parallel lines comprising different widths arrayed laterally outward in opposing lateral directions from an axial center of the set; and
the different width of each succeeding line decreasing in each of the opposing lateral directions laterally outward from the axial center of the set; and
the plurality of sets comprising a first set collection and a second set collection, the first set collection forming a first outline and the second set collection forming a second outline, the first and second outlines being concentric, the first and second outlines each comprising separate spaced segments, the lines in the first set collection being of different lengths than the lines in the second set collection, the lines in individual of the sets being equally spaced from each immediately adjacent line.

10. The monitoring mark of claim 9 wherein the segments form each of the first and second outlines to comprise a square.

11. The monitoring mark of claim 9 wherein the lines in individual of the sets are equally spaced from each immediately adjacent line.

12. The monitoring mark of claim 9 wherein all of the lines in the first set collection are of the same length.

13. The monitoring mark of claim 9 wherein all of the lines in the second set collection are of the same length.

14. The monitoring mark of claim 9 wherein the first set collection is radially outward of the second set collection, the lines in the first set collection being longer than the lines in the second set collection.

15. The monitoring mark of claim 14 wherein all of the lines in the first set collection are of the same length.

16. The monitoring mark of claim 14 wherein all of the lines in the second set collection are of the same length.

17. The monitoring mark of claim 16 wherein all of the lines in the first set collection are of the same length which is different than the same length of all of the lines in the second set.

18. A photolithography mask comprising an exposure monitoring mark, comprising:
a transparent substrate which allows radiation of a selected wavelength to pass there-through; and
a plurality of sets of lines received over the transparent substrate, the lines being opaque to the radiation of selected wavelength and forming an exposure monitoring mark, individual of the sets being longitudinally elongated along a respective longitudinal direction and comprising:
a plurality of substantially parallel spaced opaque lines comprising different widths arrayed laterally outward in opposing lateral directions from an axial center of the set, the axial center being parallel the longitudinal direction, the axial center being transparent to the radiation of selected wavelength; and
the different width of each succeeding line decreasing in each of the opposing lateral directions laterally outward from the axial center of the set, the lines in individual of the sets being equally spaced from each immediately adjacent line.

19. The mask of claim 18 wherein the photolithography mask comprises a reticle.

20. The mask of claim 18 wherein,
number of different widths is equal to one half of number of lines in individual of the sets; and
the lines on opposing lateral sides of the axial center of individual of the sets are in mirror-image relationship relative one another from the axial center.

21. The mask of claim 20 wherein the plurality of sets comprises a first set and a second set, the first set forming a first outline and the second set forming a second outline, the first and second outlines comprising concentric squares.

22. The mask of claim 21 wherein the lines in individual of the sets are everywhere spaced from one another, and wherein the sets are everywhere spaced from one another.

23. The monitoring mark of claim 18 wherein the lines in individual of the sets are equally spaced from each immediately adjacent line.

24. A phase shift mask comprising an exposure monitoring mark, comprising:
a transparent substrate which allows radiation of a selected wavelength to pass there-through;
a plurality of sets of lines received over the transparent substrate, the lines being opaque to the radiation of selected wavelength and forming an exposure monitoring mark, individual of the sets being longitudinally elongated along a respective longitudinal direction and comprising:
a plurality of substantially parallel spaced opaque lines comprising different widths arrayed laterally outward in opposing lateral directions from an axial center of the set, the axial center being parallel the longitudinal direction, the axial center being transparent to the radiation of selected wavelength; and
the different width of each succeeding line decreasing in at least one of the opposing lateral directions laterally outward from the axial center of the set, the lines in individual of the sets being equally spaced from each immediately adjacent line; and
the transparent substrate comprising phase shift regions received within only about one half one axial half from the axial center of individual of the sets.

25. The phase shift mask of claim 24 wherein the different widths in individual of the sets decrease in both of the opposing lateral directions.

26. The phase shift mask of claim 25 wherein the lines on opposing lateral sides of the axial center of individual of the sets are in mirror-image relationship relative one another from the axial center.

27. The monitoring mark of claim 24 wherein the lines in individual of the sets are equally spaced from each immediately adjacent line.

* * * * *

UNITED STATES PATENT AND TRADEMARK OFFICE
CERTIFICATE OF CORRECTION

| | | |
|---|---|---|
| PATENT NO. | : 8,313,877 B2 | Page 1 of 1 |
| APPLICATION NO. | : 12/483706 | |
| DATED | : November 20, 2012 | |
| INVENTOR(S) | : Woong Jae Chung | |

It is certified that error appears in the above-identified patent and that said Letters Patent is hereby corrected as shown below:

In the Claims:
In column 8, line 52, in Claim 24, after "about" delete "one half".

Signed and Sealed this
Seventh Day of May, 2013

Teresa Stanek Rea
*Acting Director of the United States Patent and Trademark Office*